US008358159B1

(12) United States Patent
Eker et al.

(10) Patent No.: US 8,358,159 B1
(45) Date of Patent: Jan. 22, 2013

(54) ADAPTIVE PHASE-LOCKED LOOP (PLL) MULTI-BAND CALIBRATION

(75) Inventors: Mehmet Mustafa Eker, San Marcos, CA (US); Viet Do, Carlsbad, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 131 days.

(21) Appl. No.: 13/045,032

(22) Filed: Mar. 10, 2011

(51) Int. Cl.
*H03L 7/06* (2006.01)
(52) U.S. Cl. .................................................. 327/156
(58) Field of Classification Search .................. None
See application file for complete search history.

(56) References Cited

U.S. PATENT DOCUMENTS

| | | | |
|---|---|---|---|
| 5,389,898 A | 2/1995 | Taketoshi et al. | |
| 6,998,922 B2 | 2/2006 | Jensen et al. | |
| 7,046,098 B2 * | 5/2006 | Staszewski | 331/158 |
| 7,095,287 B2 | 8/2006 | Maxim et al. | |
| 7,095,992 B2 | 8/2006 | Kim et al. | |
| 7,301,414 B2 | 11/2007 | Hino | |
| 7,375,595 B2 | 5/2008 | Serrano et al. | |
| 7,483,508 B2 * | 1/2009 | Staszewski et al. | 375/376 |
| 7,590,387 B2 | 9/2009 | Chien | |
| 7,616,069 B2 | 11/2009 | Li | |
| 7,746,179 B1 | 6/2010 | Walker et al. | |
| 8,013,682 B2 * | 9/2011 | Hu et al. | 331/16 |
| 8,217,690 B2 * | 7/2012 | Hu et al. | 327/156 |

| | | |
|---|---|---|
| 2001/0052823 A1 | 12/2001 | Hirano et al. |
| 2004/0242175 A1 | 12/2004 | Lin |
| 2005/0237119 A1 | 10/2005 | Irie |
| 2006/0139105 A1 | 6/2006 | Maxim et al. |
| 2007/0254613 A1 | 11/2007 | Cranford, Jr. et al. |
| 2008/0018411 A1 | 1/2008 | Feng et al. |
| 2008/0079509 A1 | 4/2008 | Serrano et al. |
| 2009/0113361 A1 | 4/2009 | Feng et al. |
| 2010/0141347 A1 | 6/2010 | Hsiao et al. |

OTHER PUBLICATIONS

Daly, D. and Carusone, A.C., "A Sigma-Delta Based Open-Loop Frequency Modulator", Univ. of Toronto Dept. of Elect. & Comp. Engineering, Date Unknown, 4 pages, Canada.

* cited by examiner

*Primary Examiner* — Lincoln Donovan
*Assistant Examiner* — Khareem E Almo

(57) ABSTRACT

Adaptive multi-band frequency calibration is provided for a phase-locked loop (PLL). A voltage controller oscillator (VCO) is initially selected nominally associated with first synthesized signal frequency, where the VCO is selected from a plurality of n VCOs, and each VCO is tunable across a band of synthesized signal frequencies. A lock detector compares a nominal first synthesized signal frequency to a reference signal frequency. In response to sensing a difference between the nominal first synthesizer and reference signal frequencies, an out-of-lock condition is asserted and a VCO is reselected from the plurality of n VCOs. A mid-point control voltage is supplied to a control voltage input of the reselected VCO. A difference is measured between a mid-point synthesized signal frequency and the reference signal frequency. If the difference is less than a first threshold, the reselected VCO is assigned to generate the first synthesized signal frequency.

21 Claims, 5 Drawing Sheets

ADAPTIVE PHASE-LOCKED LOOP (PLL) MULTI-BAND CALIBRATION

BACKGROUND OF THE INVENTION

1. Field of the Invention

This invention generally relates to phase-locked loops (PLLs) and, more particularly, to a system and method for adaptively calibrating a multi-band PLL.

2. Description of the Related Art

Generally, Process, Voltage, Temperature (PVT) is understood to be a relationship between two or more functions associated with matter. Electronic circuitry, especially nanometer technology, is very sensitive to PVT variations. Since the effect of PVT variations is unknown, device performance can be uncertain in response to real-time on-chip variations. Process variations occur because of imperfect fabrication processes that cause integrated circuits (IC) to exhibit different delay or frequency shifts than intended during design. IC process variations for a device result in different functional behaviors from chip-to-chip.

A multi-band PLL is intended to operate over an extremely broad range of frequencies. Several voltage controlled oscillators (VCOs) may be required if the frequency range is very broad. In that case, the range is segmented into a series of adjacent frequency bands, where each frequency band is associated with a corresponding VCO. In the case of such a multi-band PLL device, PVT variations can result in frequency band shifts between devices, requiring customer support as the device VCOs and frequency bands require case-by-case custom tuning and realignment.

It would be advantageous if a multi-band PLL could be recalibrated on-the-fly, to realign VCOs with frequency bands, accommodating unforeseen changes due to the effects of PVT.

SUMMARY OF THE INVENTION

Described herein is a phase-locked loop (PLL) that addresses the above-mentioned problems by recognizing when a voltage controlled oscillator (VCO) is operating outside of its intended frequency band, due for example, to a change in temperature of fabrication tolerances. The PLL makes open-loop measurements of each VCO, and reassigns each VCO to a new frequency band, if necessary. In one aspect, the reassignment of VCO is checked by making closed-loop measurements.

Accordingly, a method is provided in a phase-locked loop (PLL), for adaptive multi-band frequency calibration. The method selects a voltage controller oscillator (VCO) nominally associated with first synthesized signal frequency in a first frequency band, where the VCO is selected from a plurality of n VCOs, and each VCO is tunable across a band of synthesized signal frequencies in m consecutive, partially overlapping, adjacent bands. A lock detector compares a nominal first synthesized signal frequency to a reference signal frequency. In response to sensing a difference between the nominal first synthesizer and reference signal frequencies, an out-of-lock condition is asserted. In response to the out-of-lock condition, a VCO is reselected from the plurality of n VCOs. A mid-point control voltage is supplied to a control voltage input of the reselected VCO. A difference is measured between a mid-point synthesized signal frequency and the reference signal frequency. In response to the difference being less than a first threshold, the reselected VCO is assigned to generate the first synthesized signal frequency.

Additional details of the above-described method and a PLL with a system for adaptive multi-band frequency calibration are provided below.

DETAILED DESCRIPTION

Figure 1:
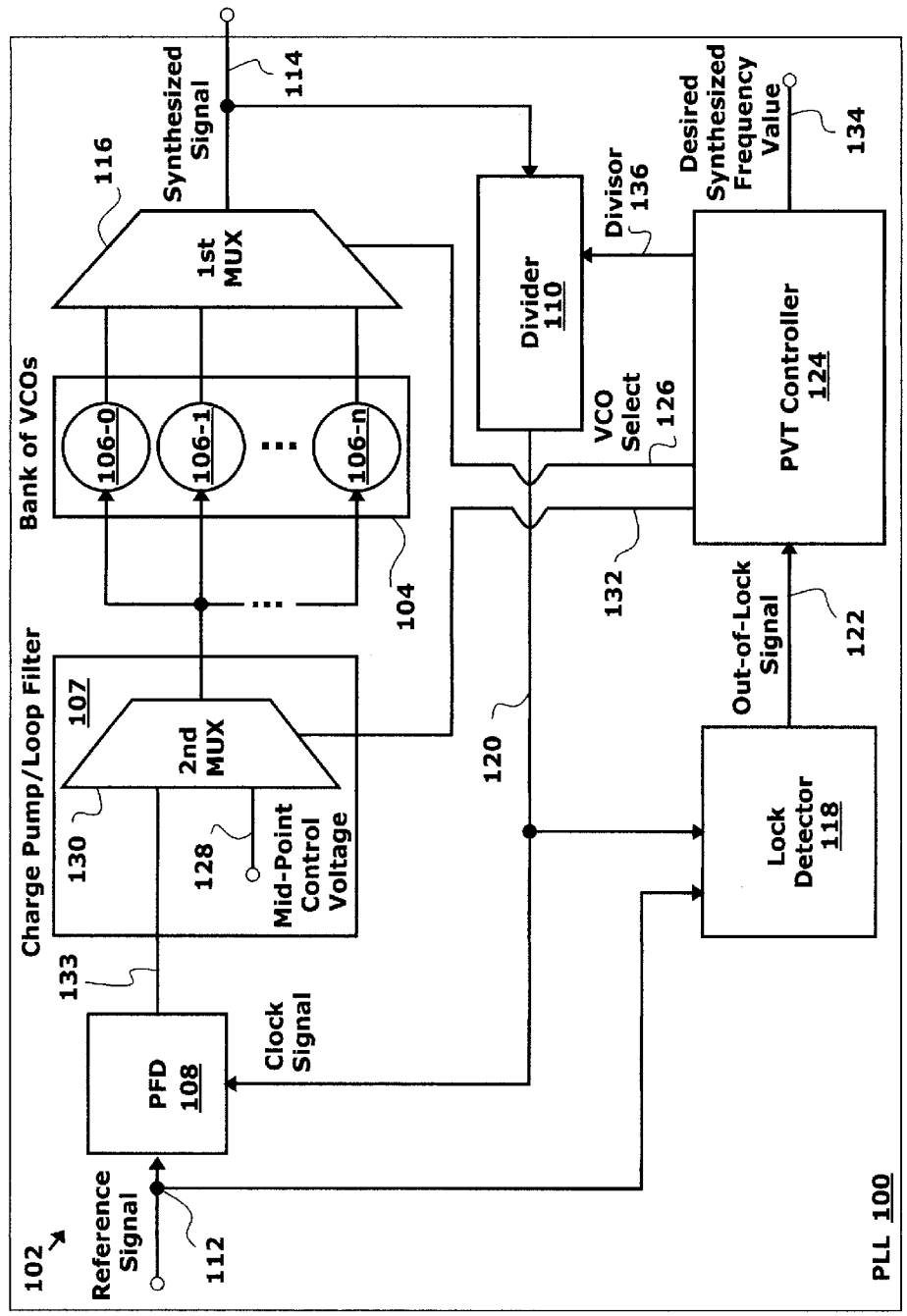
FIG. 1 is a schematic block diagram of a phase-locked loop (PLL) with a system for adaptive multi-band frequency calibration.

FIG. 1 is a schematic block diagram of a phase-locked loop (PLL) 100 with a system 102 for adaptive multi-band frequency calibration. The system 102 comprises a bank 104 of n voltage controlled oscillators (VCOs) 106-0 through 106n, where n is an integer variable not limited to any particular value. The VCOs 106 cover m consecutive, partially overlapping, adjacent frequency bands, where m is an integer variable not limited to any particular value. Generally n is greater than or equal to m.

The PLL 100 includes a phase/frequency detector (PFD) 108, a charge pump/loop filter 107, a VCO 106 initially selected from the bank 104, and feedback loop divider 110. The PFD 108 accepts a reference signal on line 112 having a frequency equal to the reference signal frequency. The initially selected VCO 106 generates a synthesized signal frequency on line 114 having a frequency nominally equal to a desired synthesized frequency in a first frequency band. A first multiplexer (MUX) 116 is shown as the VCO selection means, however, the PLL is not necessarily limited to the use of a MUX to accomplish this function. The charge pump/loop filter 107 may include an active or passive loop filter. The components of the filter and charge pump are not explicitly shown, but are well understood in the art. The charge pump/loop filter 107 supplies a mid-point control voltage on line 128. A second MUX 130 is shown capable of supplying the mid-point control voltage in response to an open-loop or mid-point voltage enable signal on line 132. Alternatively, the second MUX supplies a closed-loop control voltage on line 133 from the PFD 108 in response to a closed-loop signal on line 132.

A lock detector 118 has an input to accept a clock signal frequency (either a mid-point clock signal frequency or closed-loop clock signal frequency) on line 120 from the feedback loop divider 110 and an input on line 112 to accept the reference signal. A variety of lock detection devices are known in the art that could be adapted for use in system 102. In response to sensing a difference between the clock and reference signal frequencies, the lock detector 118 has an output on line 122 to assert an out-of-lock signal. Note, the difference may be measured, for example, in Hertz or as a parts per million (PPM) difference between the reference frequency and the clock frequency.

A process, voltage, temperature (PVT) controller 124 has an input on line 134 to accept a signal commanding that a desired synthesized signal frequency, in a first frequency band, be synthesized. The PVT controller 124 has an input on line 122 to accept the out-of-lock signal, and an output on line 126 to reselect a first VCO 106-0 from the bank 104 in response to the out-of-lock signal. The PVT controller 124 has an output on line 132 to enable either the open-loop (mid-point) or closed-loop MUX control signal on line 132. If the lock detector 118 measures a closed-loop clock signal frequency associated with the initially selected VCO 106, and asserts the out-of-lock signal, the PVT controller 124 reselects a VCO.

Subsequent to reselecting the VCO, the PVT controller 124 engages the mid-point control voltage for supply to the reselected VCO. The lock detector 118 measures a difference between a mid-point clock signal frequency and reference signal frequency, and deasserts the out-of-lock signal in response to the difference being less than a first threshold. Then, the PVT controller 124 assigns the reselected VCO to the desired synthesized signal frequency.

Otherwise, if the out-of-lock signal remains asserted after the reselection of the VCO, the PVT controller 124 iteratively reselects VCOs and engages the mid-point control voltage for supply to the iteratively reselected VCOs until the lock detector 118 deasserts the out-of-lock signal. The PVT controller 118 may enable the mid-point control voltage to the iteratively reselected VCOs in an order responsive to nominally associated frequency bands. For example, the PVT controller 124 may select the lowest frequency VCO, check for out-of-lock assertion, and reselect the next highest VCO if out-of-lock is not deasserted. In another aspect, the lock detector 118 may use a different middle frequency value for each frequency band (or VCO).

The PVT controller 124 has output on line 136 to supply a divisor to the feedback loop divider 110 associated with the desired synthesized signal frequency. The lock detector 118 references a middle frequency associated with the first frequency band, calculates a first difference between the middle frequency and the mid-point clock signal frequency, and deasserts the out-of-lock signal in response to determining that the first difference is less than the first threshold. The lock detector 118 may use a unique first threshold value for each frequency band. Although not explicitly shown in this figure, the PVT controller may be connected to the lock detector with a line that supplies the comparison thresholds for the selected VCO.

Following the above-mentioned coarse tuning process, the system may optionally enable a fine tuning process. The PVT controller 124 disengages the mid-point control voltage and engages a closed-loop control voltage, for supply to the assigned VCO, from the PFD 108. The feedback loop divider 110 accepts a closed-loop synthesizer signal frequency from the assigned VCO nominally having the desired synthesized signal frequency, and divides the closed-loop synthesizer signal by a divisor to generate a closed-loop clock signal on line 120. The PFD 108 compares the closed-loop clock signal frequency to the reference signal frequency, and in response to the comparison, frequency locks the closed-loop synthesizer signal frequency to the reference signal frequency. The lock detector 118 verifies that the closed-loop synthesizer signal frequency is frequency-locked to the reference signal frequency.

More explicitly, the lock detector 118 may calculate a second difference between the closed-clock signal frequency and the reference signal frequency. Verification that the synthesizer signal is frequency-locked to the reference signal is made by determining that the second difference is less than a second threshold. The lock detector 118 asserts the out-of-lock condition in response to determining that the second difference is greater than the second threshold. In that case, the system may return to the coarse tuning process. The lock detector 118 may use a unique second threshold value for each frequency band.

In another aspect, the system does not initially assume that the desired synthesized frequency is associated with any particular VCO. That is, upon receiving the desired synthesized frequency command, the PVT controller starts the process by initiating an open-loop search by enabling the midpoint control voltage and cycling through the VCOs until a match is found. Alternatively stated, the PVT controller iteratively selects VCOs from the bank in a predetermined order until the out-of-lock signal is deasserted. At this point, the VCO is assigned and the loop is closed. A closed-loop fine tuning analysis is optionally preformed.

Functional Description

Figure 2:
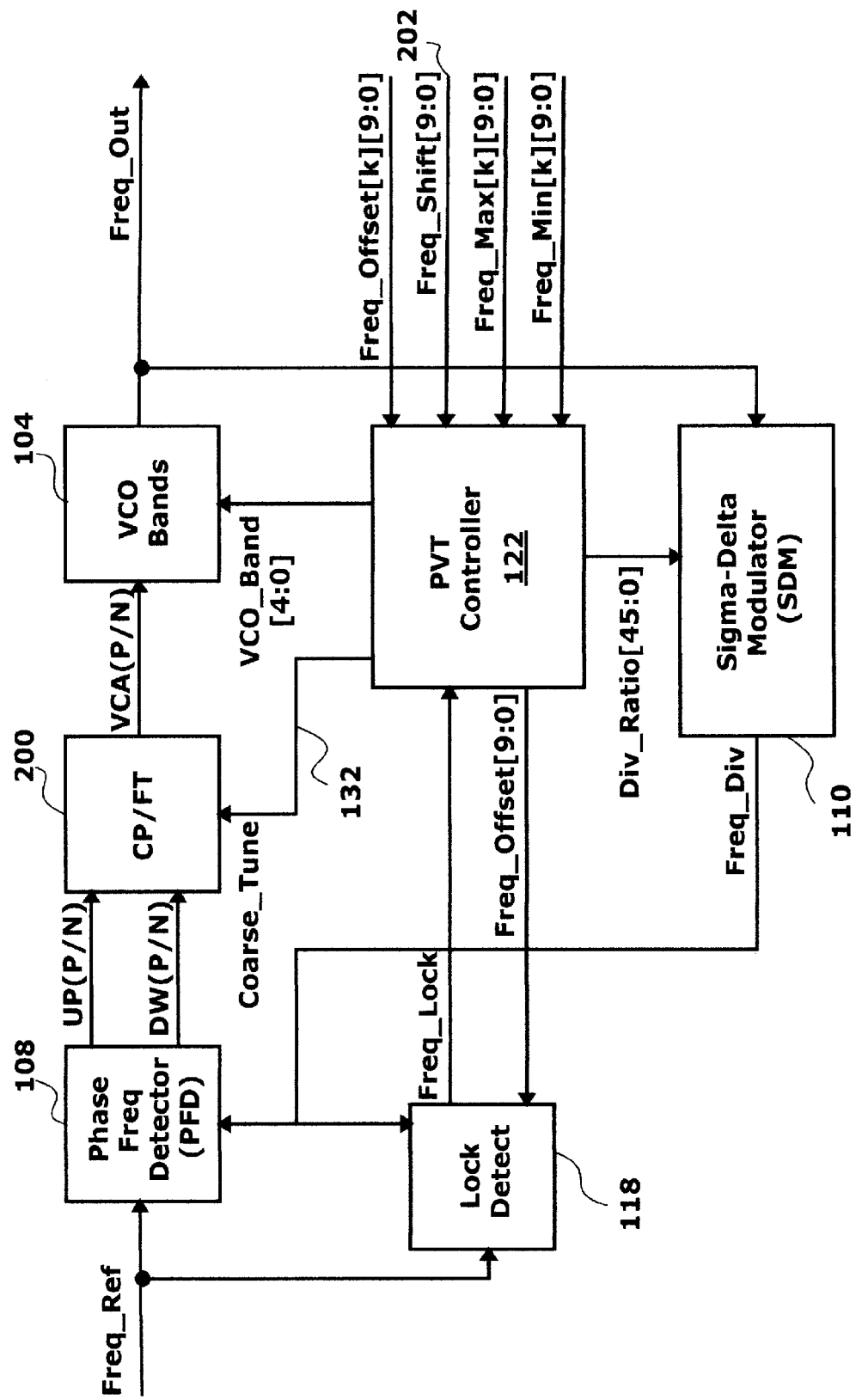
FIG. 2 is a schematic block diagram alternate depiction of the PLL and adaptive calibration system of FIG. 1.

FIG. 2 is a schematic block diagram alternate depiction of the PLL and adaptive calibration system of FIG. 1. The PLL adaptation (PLLA) device of FIG. 2 uses an automated procedure in which any PVT variation is detected by a lock detector. Then an optimal VCO Band (OVB) is identified, adapted, and used to generate the intended PLL frequency output such that $$\forall PVT, \exists OVB/freq\_out \in OVB, freq\_out = div\_ratio \times freq\_ref$$

Where freq_ref, freq_out, and div_ratio are the frequency reference, frequency output, and divide ratio of PLLA system, respectively.

While process variation can vary between chips, once a chip is fabricated, only the voltage and temperature can be varied, and the process variation remains unchanged. Therefore, in general the PLLA can be seen as the operation between two variations $P_x V_x T_x$ and $P_x V_y T_z$, where $P_x$ is the process at condition x, $V_y$ is the voltage at condition y, and $T_z$ is the temperature at condition z.

The Frequency Shift (freq_shift) on line 202 defines the maximum frequency change permitted under PVT variations. The Frequency Shift can be calculated in the device, or be data stored in memory that has collected from labs measurements, applied to all VCO bands of the same PLL device. The PVT controller 124 is used to control lock detector 118, charge pump/filter (CP/FT) 107, VCO bank 104, and the divider (Sigma-Delta Modulator) 110.

$$freq\_cntr[k] \pm freq\_shift \pm freq\_offset[k] > (freq\_cntr[k+1] \pm freq\_shift) - freq\_offset[k+1]$$

The lock detector 118 is able to operate in two modes: Coarse Tune and Fine Tune. In the Coarse Tune Mode, the coarse_tune (open-loop) signal on line 132 is asserted such that the PFD signals are not controlling the selected VCO. An open-loop coarse tuning voltage is supplied to the VCO so that the VCO outputs a signal in the center frequency range. Assuming that there are 32 VCO bands in the PLLA system, the center frequency of VCO band k is designed such that $$freq\_cntr[k] \cong (freq\_max[k] - freq\_min[k])/2$$

Where $0 \leq k < 32$ and freq_max[k], freq_min[k] are the maximum frequency and minimum frequency of bank k, respectively. In order to guarantee the continuous VCO band search operation, two back-to-back VCO bands, band (k) and VCO band (k+1), are designed to overlap by a predetermined frequency offset freq_offset[k]).

The (freq_offset[k]) array needs to setup such that during the Coarse Tune Mode, the lock detector can verify all VCO bands, to find the Optimal VCO band (OVB) which was satisfies the following conditions:

$$|freq\_ref - freq\_div| < freq\_offset[OVB]$$

The Fine Tune Mode can be enabled after the Coarse Tune Mode achieved lock. When the Fine Tune Mode is achieved (frequency locked) then clearly freq$_{ref}$=freq$_{div}$ or $$freq\_out = div\_ratio \times freq\_ref$$

Under $P_xV_xT_x$, the PVT controller steps up from the lowest VCO band and applies the freq_offset for each band. If the Coarse Tune freq_lock is asserted (out-of-lock is deasserted), then the OVB is found. Otherwise, the next VCO band is checked. After the Coarse Tune and Fine Tune are achieved, the frequency is locked under $P_xV_xT_x$. If the PVT variation changes to $P_xV_yT_z$, then the whole PLLA is restarted.

Figure 3:
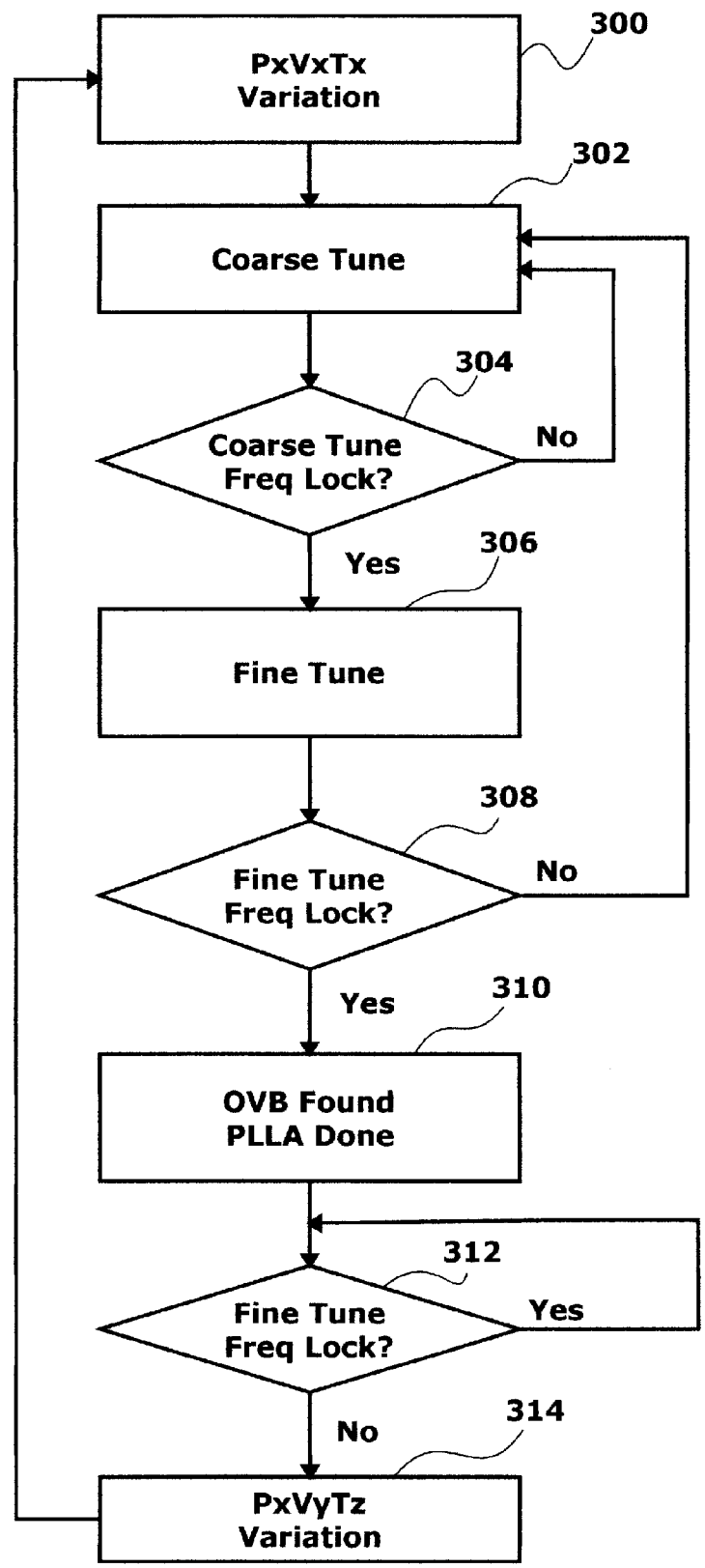
FIG. 3 is a flowchart illustrating a PLLA calibrated in response to PVT variations.

FIG. 3 is a flowchart illustrating a PLLA calibrated in response to PVT variations. If a PVT variation occurs in Step 300, a coarse tune process begins in Step 302. If a coarse tune lock occurs, then the process continues to Step 306. Otherwise a new VCO is selected in Step 304. Step 306 begins the fine tune process. If a fine tune lock occurs the process continues to Step 310. Otherwise, the process returns to Step 302 In normal (closed-loop) operation the lock detector constantly monitors the synthesized signal (Step 312). If a PVT variation occurs (Step 314), the process returns to Step 302. To optimize the PLLA process, $$freq\_max[k], freq\_min[k], freq\_offset[k], freq\_shift$$

can be reprogrammed to apply any PVT variation.

Figure 4A:
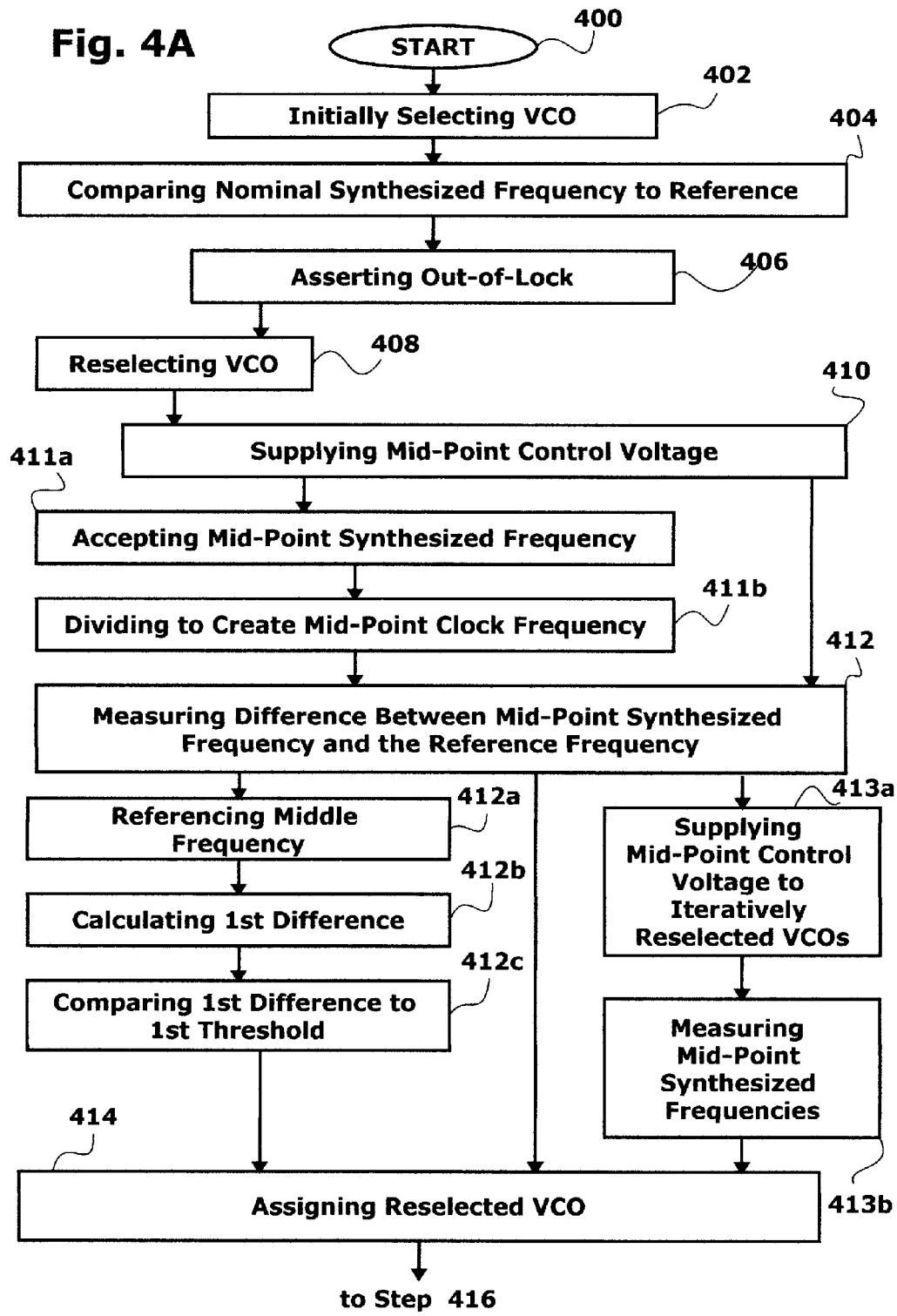
FIGS. 4A and 4B are flowcharts illustrating a method for adaptive multi-band frequency calibration in a PLL.
Figure 4B:
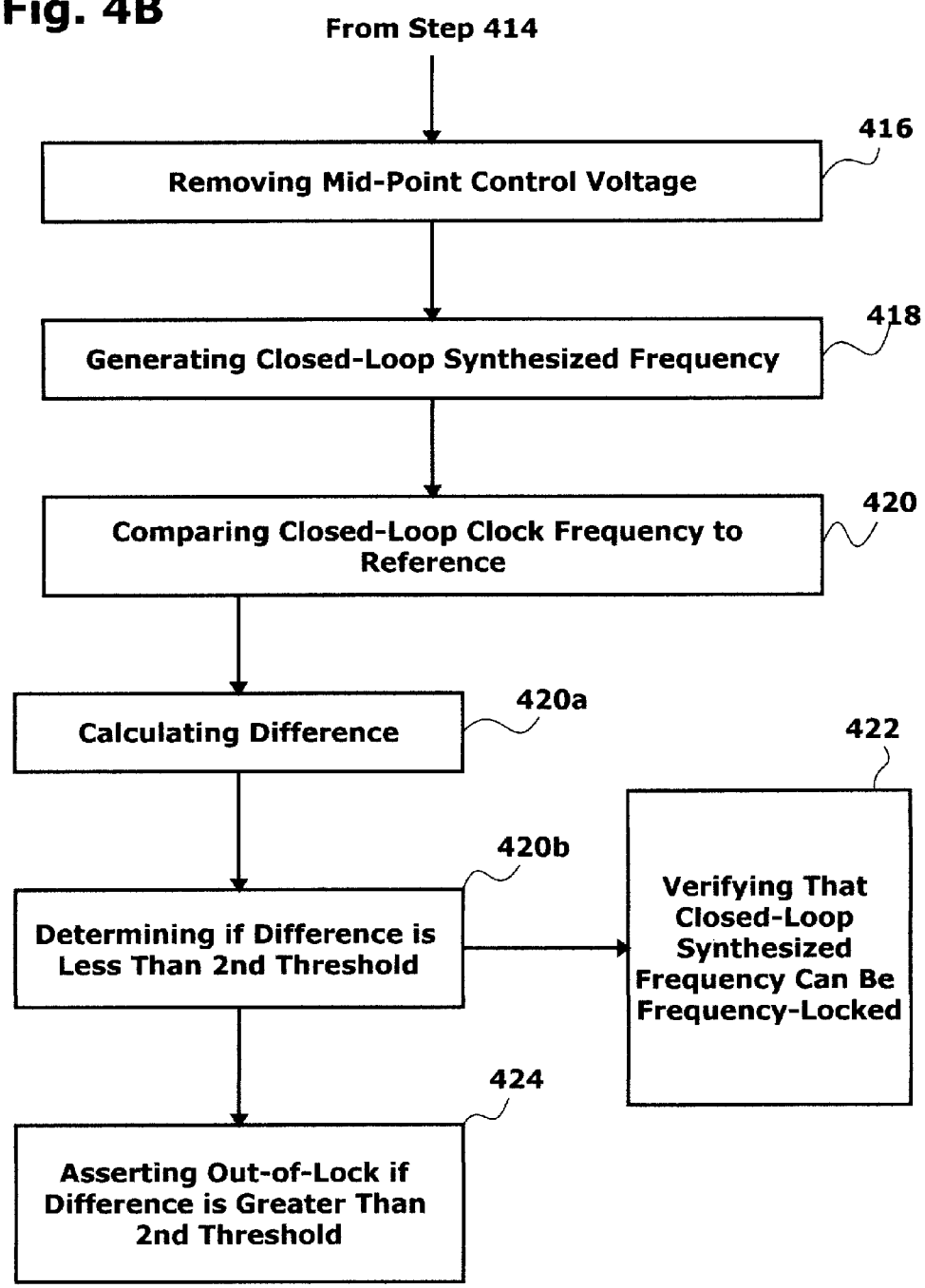

FIGS. 4A and 4B are flowcharts illustrating a method for adaptive multi-band frequency calibration in a PLL. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 400.

Step 402 initially selects a VCO nominally associated with first synthesized signal frequency in a first frequency band, where the VCO is selected from a plurality of n VCOs, and each VCO is tunable across a band of synthesized signal frequencies in m consecutive, partially overlapping, adjacent bands. In Step 404 a lock detector compares a nominal first synthesized signal frequency to a reference signal frequency. In response to sensing a difference between the nominal first synthesizer and reference signal frequencies, Step 406 asserts an out-of-lock condition. In response to the out-of-lock condition, Step 408 reselects a VCO from the plurality of n VCOs. Step 410 supplies a mid-point control voltage to a control voltage input of the reselected VCO. Step 412 measures a difference between a mid-point synthesized signal frequency and the reference signal frequency. In response to the difference being less than a first threshold, Step 414 assigns the reselected VCO to generate the first synthesized signal frequency.

In response to the difference between the mid-point synthesized signal frequency and the reference signal frequency being greater than the first threshold, Step 413a supplies a mid-point control voltage to iteratively reselected VCOs from the plurality of n VCOs. Step 413b measures the mid-point synthesized signal frequency of each iteratively reselected VCO. Then, assigning the reselected VCO in Step 414 assigning the iteratively reselected VCO associated with a measured difference less than the first threshold. In one aspect, supplying the mid-point control voltage to the iteratively reselected VCOs in Step 413a includes iteratively reselecting VCOs in an order responsive to nominally associated frequency bands. For example, the VCOs may be selected in an order from highest frequency to lowest frequency.

In one aspect, a PLL in Step 411a accepts the mid-point synthesized signal frequency from the reselected VCO, and Step 411b divides the mid-point synthesized signal frequency by a divisor to generate a mid-point clock signal. Then, measuring the difference between the mid-point synthesized signal frequency and the reference signal frequency in Step 412 includes comparing the mid-point clock signal frequency to the reference signal frequency.

In one aspect, comparing the mid-point clock signal frequency to the reference signal frequency in Step 412 includes substeps. Step 412a references a middle frequency associated with the first frequency band. Step 412b calculates a first difference between the first frequency band middle frequency and the mid-point clock signal frequency. Step 412c compares the first difference to the first threshold.

In another aspect, comparing the first difference to the first threshold further in Step 412c includes substeps. In response to determining that the first difference exceeds the first threshold, Step 412c1 asserts an out-of-lock condition. In response to determining that the first difference is less than the first threshold, Step 412c2 deasserts the out-of-lock condition.

In one aspect, subsequent to assigning the reselected VCO in Step 414, Step 416 removes the mid-point control voltage and supplies a closed-loop control voltage to assigned VCO. In Step 418 the assigned VCO generates a closed-loop synthesized signal frequency. Step 420 compares a closed-loop clock signal frequency to the reference signal frequency. In response to the comparison, in Step 422 the lock detector verifies that the closed-loop synthesized signal frequency can be frequency-locked to the reference signal using the assigned VCO.

In one aspect, comparing the closed-loop clock signal frequency to the reference signal frequency in Step 420 includes substeps. Step 420a calculates a difference between the closed-loop clock signal frequency and the reference signal frequency. Step 420b determines that the difference is less than a second threshold. In response to determining that the difference is greater than the second threshold, Step 424 asserts the out-of-lock condition.

A system and method have been provided for adaptively calibration a multi-band PLL. Examples of hardware devices and process flows have been presented to illustrate the invention. However, the invention is not limited to merely these examples. Other variations and embodiments of the invention will occur to those skilled in the art.

We claim:

1. In a phase-locked loop (PLL), a method for adaptive multi-band frequency calibration comprising:
   initially selecting a voltage controller oscillator (VCO) nominally associated with a first synthesized signal frequency in a first frequency band, where the VCO is selected from a plurality of n VCOs, and each VCO is tunable across a band of synthesized signal frequencies in m consecutive, partially overlapping, adjacent bands;
   a lock detector comparing a nominal first synthesized signal frequency to a reference signal frequency;
   in response to sensing a difference between the nominal first synthesizer and reference signal frequencies, asserting an out-of-lock condition;
   in response to the out-of-lock condition, reselecting a VCO from the plurality of n VCOs;
   supplying a mid-point control voltage to a control voltage input of the reselected VCO;

measuring a difference between a mid-point synthesized signal frequency and the reference signal frequency; and, in response to the difference being less than a first threshold, assigning the reselected VCO to generate the first synthesized signal frequency.

2. The method of claim 1 further comprising:

in response to the difference between the mid-point synthesized signal frequency and the reference signal frequency being greater than the first threshold, supplying a mid-point control voltage to iteratively reselected VCOs from the plurality of n VCOs;

measuring the mid-point synthesized signal frequency of each iteratively reselected VCO; and, wherein assigning the reselected VCO to generate the first synthesized signal frequency includes assigning the iteratively reselected VCO associated with a measured difference less than the first threshold.

3. The method of claim 2 further comprising:

in a PLL, accepting the mid-point synthesized signal frequency from the reselected VCO;

dividing the mid-point synthesized signal frequency by a divisor to generate a mid-point clock signal; and, wherein measuring the difference between the mid-point synthesized signal frequency and the reference signal frequency includes comparing the mid-point clock signal frequency to the reference signal frequency.

4. The method of claim 3 further comprising:

subsequent to assigning the reselected VCO, removing the mid-point control voltage and supplying a closed-loop control voltage to assigned VCO;

the assigned VCO generating a closed-loop synthesized signal frequency;

comparing a closed-loop clock signal frequency to the reference signal frequency; and, in response to the comparison, the lock detector verifying that the closed-loop synthesized signal frequency can be frequency-locked to the reference signal using the assigned VCO.

5. The method of claim 4 wherein comparing the closed-loop clock signal frequency to the reference signal frequency includes:

calculating a difference between the closed-loop clock signal frequency and the reference signal frequency; and, determining that the difference is less than a second threshold.

6. The method of claim 5 further comprising:

in response to determining that the difference is greater than the second threshold, asserting the out-of-lock condition.

7. The method of claim 3 wherein comparing the mid-point clock signal frequency to the reference signal frequency includes:

referencing a middle frequency associated with the first frequency band;

calculating a first difference between the first frequency band middle frequency and the mid-point clock signal frequency; and, comparing the first difference to the first threshold.

8. The method of claim 7 wherein comparing the first difference to the first threshold further includes:

in response to determining that the first difference exceeds the first threshold, asserting an out-of-lock condition; and, in response to determining that the first difference is less than the first threshold, deasserting the out-of-lock condition.

9. The method of claim 2 wherein supplying the mid-point control voltage to the iteratively reselected VCOs includes iteratively reselecting VCOs in an order responsive to nominally associated frequency bands.

10. In a phase-locked loop (PLL), a system for adaptive multi-band frequency calibration comprising:

a bank of n voltage controlled oscillators (VCOs) covering m consecutive, partially overlapping, adjacent frequency bands;

a PLL including a phase/frequency detector (PFD), a charge pump/loop filter, a VCO initially selected from the bank, and a feedback loop divider, the PFD accepting a reference signal frequency and the initially selected VCO generating a closed-loop synthesized signal frequency nominally equal to a desired synthesized signal frequency;

a lock detector having an input to accept a clock signal frequency from the feedback loop divider and an input to accept the reference signal frequency, and in response to sensing a difference between the clock and reference signal frequencies, the lock detector having an output to assert an out-of-lock signal;

a process, voltage, temperature (PVT) controller having an input to accept a signal commanding that the desired synthesized signal frequency in a first frequency band be synthesized, an input to accept the out-of-lock signal, an output to reselect a VCO from the bank in response to the out-of-lock signal, and an output to engage a mid-point control voltage for supply to a control voltage input of the reselected VCO;

wherein the lock detector measures a closed-loop clock signal frequency associated with the initially selected VCO, and asserts the out-of-lock signal; and, wherein the PVT controller reselects a VCO.

11. The system of claim 10 wherein the PVT controller, subsequent to reselecting the VCO, engages the mid-point control voltage for supply to the reselected VCO;

wherein the lock detector measures a difference between a mid-point clock signal frequency and reference signal frequency, and deasserts the out-of-lock signal in response to the difference being less than a first threshold; and, wherein the PVT controller assigns the reselected VCO to the desired synthesized signal frequency.

12. The system of claim 11 wherein the PVT controller iteratively reselects VCOs and engages the mid-point control voltage for supply to the iteratively reselected VCOs until the lock detector deasserts the out-of-lock signal.

13. The system of claim 12 wherein the PVT controller has output to supply a divisor to the feedback loop divider associated with the desired synthesized signal frequency; and, wherein the lock detector references a middle frequency associated with the first frequency band, calculates a first difference between the middle frequency and the mid-point clock signal frequency, and deasserts the out-of-lock signal in response to determining that the first difference is less than the first threshold.

14. The system of claim 13 wherein the lock detector uses a unique first threshold value for each frequency band.

15. The system of claim 11 wherein the PVT controller disengages the mid-point control voltage and engages a closed-loop control voltage, for supply to the assigned VCO, from the PFD;

wherein the feedback loop divider accepts a closed-loop synthesizer signal frequency from the assigned VCO nominally having the desired synthesized signal frequency, and divides the closed-loop synthesizer signal by a divisor to generate a closed-loop clock signal;

wherein the PFD compares the closed-loop clock signal frequency to the reference signal frequency, and in response to the comparison, frequency locks the closed-loop synthesizer signal frequency to the reference signal frequency; and, wherein the lock detector verifies that the closed-loop synthesizer signal frequency is frequency-locked to the reference signal frequency.

16. The system of claim 15 wherein the lock detector calculates a second difference between the closed-clock signal frequency and the reference signal frequency, and verifies that the synthesizer signal is frequency-locked to the reference signal by determining that the second difference is less than a second threshold.

17. The system of claim 16 wherein the lock detector asserts the out-of-lock condition in response to determining that the second difference is greater than the second threshold.

18. The system of claim 16 wherein the lock detector uses a unique second threshold value for each frequency band.

19. The system of claim 11 wherein the PVT controller enables the mid-point control voltage to the iteratively reselected VCOs in an order responsive to nominally associated frequency bands.

20. In a phase-locked loop (PLL), a method for adaptive multi-band frequency calibration comprising:

a means for selecting a voltage controller oscillator (VCO) nominally associated with first synthesized signal frequency in a first frequency band, where the VCO is selected from a plurality of n VCOs, and each VCO is tunable across a band of synthesized signal frequencies in m consecutive, partially overlapping, adjacent bands;

a means for comparing a nominal first synthesized signal frequency to a reference signal frequency;

in response to sensing a difference between the nominal first synthesizer and reference signal frequencies, a means for asserting an out-of-lock condition;

in response to the out-of-lock condition, a means for reselecting a VCO from the plurality of n VCOs;

a means for supplying a mid-point control voltage to a control voltage input of the reselected VCO;

a means for measuring a difference between a mid-point synthesized signal frequency supplied by the reselected VCO and the first synthesized signal frequency; and, in response to the difference being less than a first threshold, a means for assigning the reselected VCO to generate the first synthesized signal frequency.

21. In a phase-locked loop (PLL), a system for adaptive multi-band frequency calibration comprising:

a bank of n voltage controlled oscillators (VCOs) covering m consecutive, partially overlapping, adjacent frequency bands;

a PLL including a phase/frequency detector (PFD), a charge pump/loop filter, a feedback loop divider, and a selected VCO;

a lock detector having an input to accept a clock signal frequency from the feedback loop divider and an input to accept the reference signal frequency, and in response to sensing a difference between the clock and reference signal frequencies, the lock detector having an output to assert an out-of-lock signal;

a process, voltage, temperature (PVT) controller having an input to accept a signal commanding that a desired signal frequency be synthesized, an input to accept the out-of-lock signal, an output to select a VCO from the bank, in a predetermined order, in response to the out-of-lock signal, and an output to engage a mid-point control voltage for supply to a control voltage input of the selected VCO, wherein the PVT controller iteratively selects VCOs from the bank in a predetermined order until the out-of-lock signal is deasserted.

* * * * *